US005773986A

United States Patent [19]

Thompson et al.

[11] Patent Number: 5,773,986

[45] **Date of Patent: *Jun. 30, 1998**

[54] SEMICONDUCTOR WAFER CONTACT SYSTEM AND METHOD FOR CONTACTING A SEMICONDUCTOR WAFER

[75] Inventors: Patrick F. Thompson, Chandler; William M. Williams, Gilbert; Scott E. Lindsey, Mesa, all of Ariz.; Barbara Vasquez, Austin, Tex.

[73] Assignee: Motorola, Inc, Schaumburg, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 416,121

[22] Filed: Apr. 3, 1995

[51] Int. Cl.[6] .................... G01R 1/073

[52] U.S. Cl. .................... 324/754; 324/760

[58] Field of Search .................... 324/754, 757, 324/758, 760; 438/14, 15, 16, 17, 18

[56] References Cited

U.S. PATENT DOCUMENTS

| | | | |
|---|---|---|---|
| 4,602,678 | 7/1986 | Fick | 165/80.3 |
| 4,968,931 | 11/1990 | Littlebury et al. | 324/760 |
| 4,975,637 | 12/1990 | Frankeny et al. | 324/760 |
| 4,980,637 | 12/1990 | Huff et al. . | |
| 4,994,735 | 2/1991 | Leedy | 324/754 |
| 5,008,615 | 4/1991 | Littlebury | 324/754 |
| 5,148,103 | 9/1992 | Pasiecznik, Jr. . | |
| 5,180,977 | 1/1993 | Huff . | |
| 5,252,916 | 10/1993 | Swart | 324/757 |
| 5,264,787 | 11/1993 | Woith et al. . | |
| 5,397,997 | 3/1995 | Tuckerman et al. | 324/754 |

OTHER PUBLICATIONS

Dennis J. Genin et al., "Probing Considerations in C-4 Testing of IC Wafers," ICMCM Proceedings 1992, pp. 124–128.

Packard Hughes Interconnect Product Brochure.

*Primary Examiner*—Ernest F. Karlsen

*Attorney, Agent, or Firm*—George C. Chen

[57] ABSTRACT

A semiconductor wafer contact system includes a sealed bladder (32) containing incompressible material. The sealed bladder (32) presses against a flexible circuit layer (28) including an array of electrical contacts (30). The bladder (32) forces the array of electrical contacts (30) against a corresponding array of device electrical contacts (12) on die (11) of a semiconductor wafer (10). The bladder (32) adapts in shape to compensate for die level and wafer level irregularities in contact height and non-parallelism. Additionally, bladder (32) ensures a constant force between membrane contacts (30) and die contacts (12), across the entire wafer (10).

5 Claims, 2 Drawing Sheets

SEMICONDUCTOR WAFER CONTACT SYSTEM AND METHOD FOR CONTACTING A SEMICONDUCTOR WAFER

FIELD OF THE INVENTION

The present invention relates generally to nondestructive testing of integrated circuits (ICs), and more specifically to semiconductor wafer contact test systems and methods for contacting semiconductor wafers.

BACKGROUND OF THE INVENTION

Integrated circuits are manufactured by forming multiple layers of semiconductor materials generally with repeated and fixed patterns to develop a plurality of "dice" on a thin plane or substrate, i.e., a semiconductor wafer. The wafers are then cut into individual die for further processing and packaging. The dice must be inspected and tested to ensure the quality and reliability of the final products made from the semiconductor dice. Sometimes dice are tested after they are cut into individual die from the whole wafer. However, dice may also be tested simultaneously, in groups consisting of part of a wafer or a whole wafer. Testing dice before separation is often more cost effective.

The testing operations is typically performed at a wafer level before the wafers are sawed apart into individual die. The testing system typically comprises a test controller, which executes and controls the test programs; a wafer dispensing system, which mechanically handles and positions the wafers for testing; and a probe card, which maintains an accurate mechanical contact with the device under test (DUT) and provides an electrical interface between the test control and the DUT. The probe card includes a printed circuit board known as the "performance board." A performance board may be designed for individualized devices or IC families. The probe card also has a plurality of test probes which are accurately positioned to coincide with the input/output (I/O) pads of the DUT.

Under control of the test controller, a set of testing signals including specific combinations of voltages and currents are generated and transmitted to the DUT via the performance board and the test probes. The output of the dice in response to the test signals are detected and transmitted by the probes to the test controller via the performance board. The voltage, current or frequency responses from the DUT are analyzed and compared with a set of predetermined allowable ranges. Dice which fail to meet the testing criteria are identified and rejected and the remainder of the tested chips are accepted for further process.

A conventional type of wafer probe card consists of a set of fine styluses or probes mounted on the performance board. The probes are arranged so that their tips form a pattern identical to that of the DUT's contact pads. The other ends of the probes are soldered to the traces of the printed circuits on the performance board for further connection to the test controller. The wafer dispensing system brings the wafer to be tested to an aligned position under the probe card and raises the wafer until proper contacts are established between the probes and DUT's I/O pads.

Membrane probe technology has been developed by forming an array of microcontacts, generally known as contact bumps, on a thin and flexible dielectric film, i.e., a membrane. For each contact bump, a transmission line is formed on the membrane for electric connection to the performance board. The contact bumps are often formed by metal plating methods. The transmission lines are formed by use of photolithographic methods. Contact bumps are formed directly on the membrane, and become an integral part of the membrane probe, unlike conventional probes which require mechanical attachment of electrical contacts such as needles or blades. Contact bumps can be formed to create a large number of contacts with high probe density. Additionally, improvements in mechanical and electrical performance are realized by membrane probes because of the simplicity of configuration.

One critical prerequisite for IC test by either the membrane or conventional probe cards is to establish proper electrical contact between the probes and the DUT's I/O pads. In practical testing operations, the probe card and its probe tips or the contact bumps may not be exactly coplanar with the surface of the DUT's I/O pads. Furthermore, the electrical contacts on the membrane, and the pads, bumps or other types of contacts on the semiconductor die may be somewhat fragile. It is important, therefore, that an accurate and controllable force be employed when contacting probes or membrane contacts to die contacts.

Consequently, a semiconductor wafer contact system is desirable which is capable of dealing with die level (local) and wafer level (global) surface irregularities, and non-planarities due to process variations, etc., of wafer pad or bump heights, as well as fixture contact height irregularities. Additionally, a system is desirable which provides a consistent force on all device contacts, rather than an irregular force which may damage contacts and alter electrical characteristics. Furthermore, a system is desirable which allows device testing on a group of dice or at a wafer level, rather than just at an individual die level.

DETAILED DESCRIPTION OF THE DRAWINGS

The semiconductor wafer contact system in accordance with the present invention utilizes a sealed bladder filled with incompressible material to provide planarity and equal force across contacts. The system compensates for local non-planarity of the die or wafer under test, and for global non-parallelism between the plane of the probe and the plane of the die or wafer, by employing a sealed bladder containing incompressible material to provide force transfer from the fixture to the probe-die or probe-wafer contacts. The bladder also serves as a medium which transfers heat from the die or wafer surface. A mixture of inert liquid or gel and particles of a highly heat conductive material is a preferable example of bladder contents.

Because the sealed bladder is flexible and yet of constant volume, local non-planarities will not result in damage to the probe or wafer surface (in the case of high spots) or create non-continuous electrical paths (for low spots). The flexibility or compliance of the bladder allows the system to adapt in shape and rise above high spots or move down into low spots. Because the bladder is sealed, and therefore constant volume, the force remains consistent across all contacts. Bladder contents that move away from a high spot is redistributed to remaining areas. Similarly, liquid moves into low spots from surrounding areas as necessary. Furthermore, the system additionally comprises a support plate supporting the wafer and a spring or springs supporting the support plate. The springs and associated fixturing are selected to provide a desired force between the wafer and membrane probe.

Therefore, a system in accordance with the present invention allows both quick prototype and low-cost high-volume fabrication of test systems for various die. In a system in accordance with the present invention, a membrane having contacts aligned to the electrical contacts of the die to be tested is situated adjacent to the sealed bladder. The bladder may be attached to the membrane and associated fixturing with adhesive. Alternatively, the bladder may be placed in a retaining cage which is an integral part of the associated fixturing. Technology for fabricating and attaching such a membrane is well known in the art. The resulting membrane-bladder assembly can then be placed in a test fixture frame in accordance with well known methods. The fixture frame may be used to hold the wafer to be tested and membrane-bladder assembly together for electrical contact, and to align the test contacts to the wafer pads or bumps. The system is constructed for easy replacement of the flexible membrane. This allows long-term use of other components when the membrane becomes worn or damaged.

Consequently, use of the sealed bladder in accordance with the present invention requires less precision in substrate planarity and parallelism between fixture contacts and wafer than is required in conventional test systems.

Figure 1:
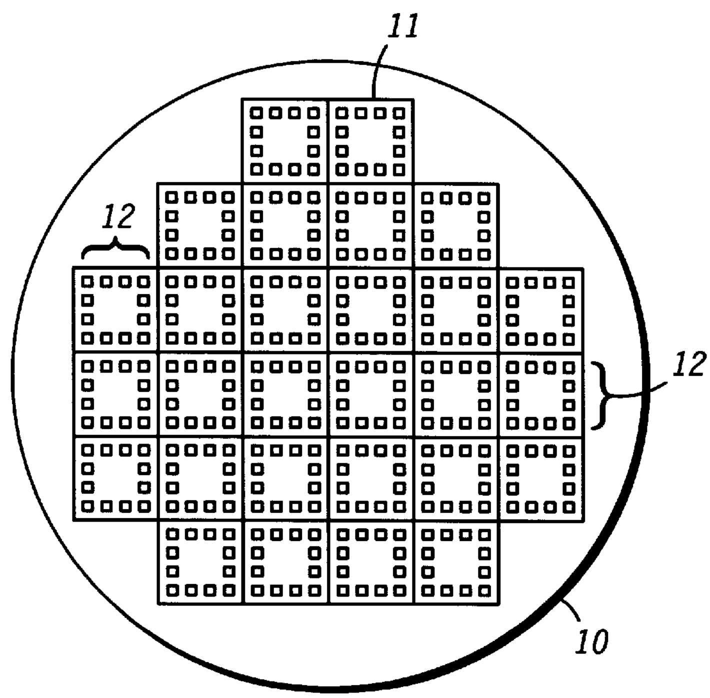
FIG. 1 is a top view of a semiconductor wafer including a plurality of semiconductor die.
Figure 2:
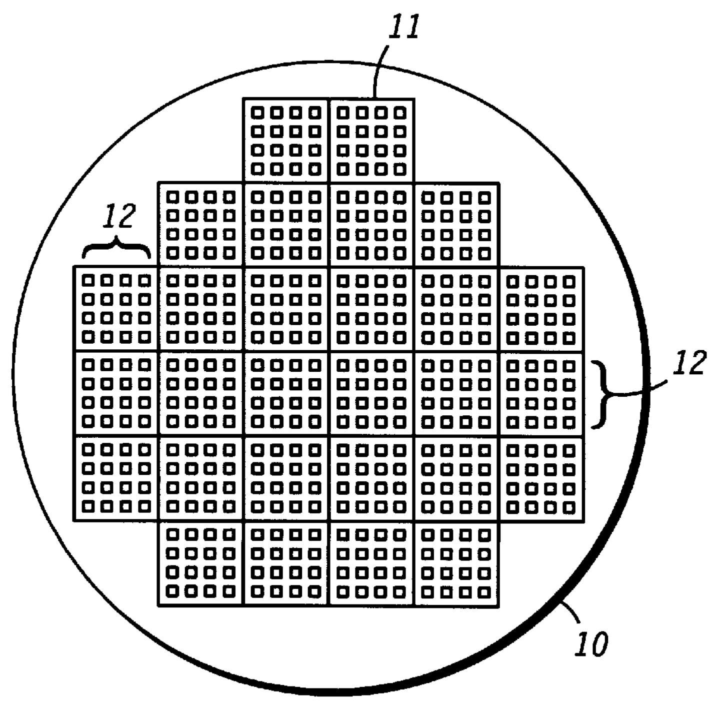
FIG. 2 is a top view of a semiconductor wafer including a plurality of semiconductor die with an alternate contact layout.

Turning to the FIGS. for a more detailed understanding of the preferred embodiment, FIG. 1 is a top view of an exemplary semiconductor wafer 10 including a plurality of device dice 11. Each die 11 includes a plurality of electrical contacts 12, typically in the form of a grid or array. FIG. 1 illustrates dice 11 of wafer 10 having contacts 12 along their periphery. Turning now to FIG. 2, FIG. 2 illustrates dice 11 of wafer 10 having contacts 12 in a full array across each die. The different contact patterns of FIG. 1 and FIG. 2 are illustrative, and it will be clear to one skilled in the art that many patterns may be used, depending upon the particular application. For any pattern, the electrical contacts of each die 11 combine to form a larger array of electrical contacts across the entire wafer 10.

Figure 3:
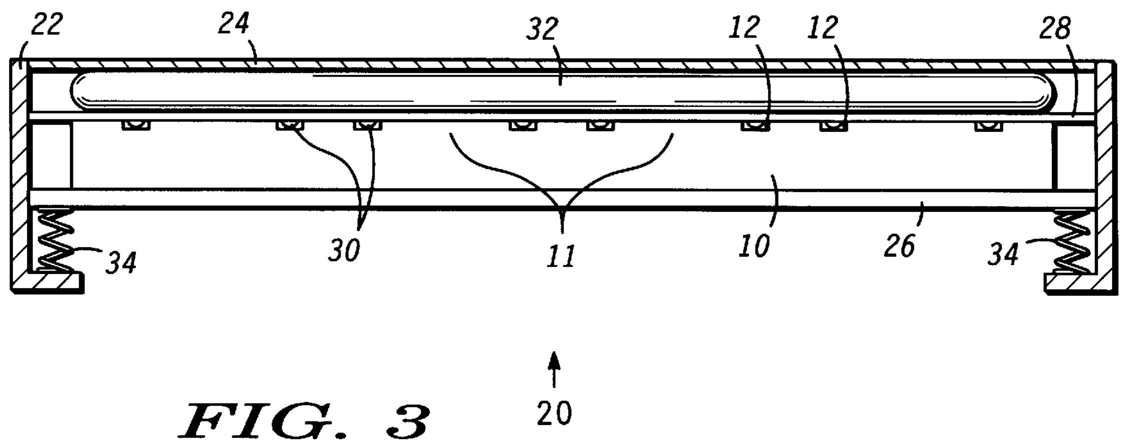
FIG. 3 is a side view cross-section of a semiconductor wafer contact system.

FIG. 3 is a side view cross section of a system in accordance with the present invention, illustrating important elements of the preferred embodiment. FIG. 3 shows semiconductor wafer contact test system 20. Contact system 20 comprises fixturing including outer wall 22, top plate 24 and support plate 26. Semiconductor wafer 10 is supported by support plate 26. Semiconductor wafer 10 comprises a plurality of device dice 11. Individual die 11, and therefore entire wafer 10, comprise a plurality of electrical contacts 12 which form an array or grid.

Adjacent to wafer 10 is flexible membrane 28. A plurality of electrical contacts 30 are formed on flexible membrane 28. Interconnect lines, not shown, allow signals to be transmitted to and from contacts 30. In the preferred embodiment, contacts 30 comprise electrically conductive bumps 30. Consequently, flexible membrane 28 provides a flexible circuit layer 28.

Adjacent to membrane 28 is sealed bladder 32. Sealed bladder 32 preferably comprises a sealed compliant bladder containing an incompressible material with high heat conductance. Preferably, the membrane is a material that maintains strength and elasticity over a large temperature range. A silicone rubber is one example of such a material. Bladder contents are a thermally and chemically stable liquid, and can include high thermal conductivity solid particles to enhance bladder heat transfer performance.

In the past, unsealed, inflatable bladders have been proposed for similar use, as shown for example in U.S. Pat. No. 4,968,931 to Littlebury et al., which is incorporated herein by this reference. However, the unsealed, inflatable bladder does not offer the same reliability and consistency as the sealed bladder because it must be inflated with every operation. That is, bladder volume may vary from test to test, and reliable mechanical systems are required in order to accurately inflate such an unsealed bladder. Sealed bladders, on the other hand, guarantee reliable and consistent force, among other advantages, and eliminate the need for accurate inflating systems.

Contact system 20 additionally comprises springs 34. Springs 34 are shown as individual coil springs. However, those skilled in the art will recognize that outer wall 22 can be a cylindrical wall and therefore springs 34 may be replaced by a single coil spring having the diameter suitable for outer wall 22.

Springs 34 support and push support plate 26 against wafer 10. Consequently, the entire test fixture is under compression, with bladder 32 pushing membrane 28 and its associated electrical contacts 30 against wafer 10 and its associated electrical contacts 12. It will be understood that the membrane 28 moves as necessary, as the cavity occupied by bladder 32 narrows and bladder 32 compresses.

Figure 4:
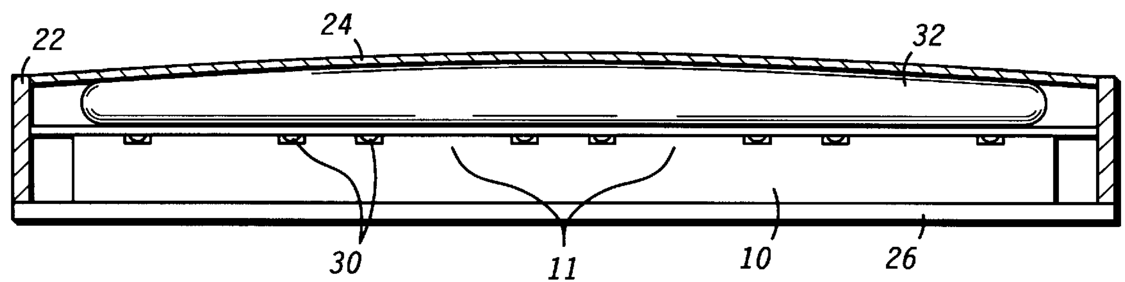
FIG. 4 is a side view cross-section of a semiconductor wafer contact system with an alternate top plate configuration.

As an alternative to springs 34 shown in FIG. 3 is the configuration shown in FIG. 4. As shown in FIG. 4, a spring material may be used for top plate 24, eliminating the need for separate springs 34. Top plate 24 can be a leaf spring configuration, as is known in the art. It is also possible to use a system with no separate springs, relying on the elasticity of the bladder to provide suitable force.

As explained above, sealed bladder 32 preferably contains an incompressible material and is compliant, also referred to as elastomeric. For example, bladder 32 can be a sealed silicone rubber membrane filled with a Fluorinert™—metal particle mixture. Consequently, bladder 32 adapts in shape to compensate for any local or global variations and non-planarities of wafer 10 and electrical contacts 12. Preferred embodiments of the invention are expected to be used at temperatures above room temperature (up to approximately 200° C.) or below room temperature (down to approximately −50° C.). One of ordinary skill will recognize that particular materials for the bladder exterior and bladder-fill must be selected which maintain the required properties at the testing temperatures. Such materials are readily available, as will be recognized by those skilled in the art, and the choice will depend on the particular application.

Figure 5:
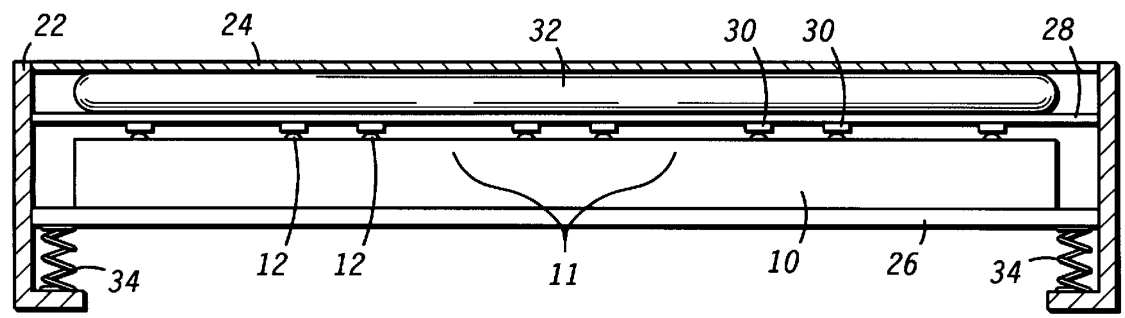
FIG. 5 is a side view cross-section of a semiconductor wafer contact system with an alternate electrical contact configuration.

FIG. 5 illustrates an alternate embodiment of the invention wherein the wafer 10 has bumps 12 for electrical contacts, while the membrane 28 has raised, flat pads 30 for electrical contacts. It will be understood by those skilled in the art that a variety of combinations and configurations of electrical contacts may be used, as required by any specific application of the invention.

Accordingly, in view of the features and details discussed above, it will be apparent that a system in accordance with the present invention provides advantageous compliance and compensation for contacting and testing semiconductor dice across the surface of a semiconductor wafer. Although a particular preferred embodiment has been shown and described, modifications and improvements will occur readily to those skilled in the art. It should be understood, therefore, that this invention is not limited to the particular form shown and described, and it is intended that the appended claims cover all modifications that do not depart from the spirit and scope of the invention.

We claim:

1. A semiconductor wafer test system comprising:

a flexible membrane comprising a plurality of electrical contacts;

a bladder adjacent to a side of the flexible membrane opposite the plurality of electrical contacts, a cavity inside the bladder; and heat conductive particles in the cavity.

2. The system of claim 1 wherein the bladder comprises a liquid filled compliant bag.

3. The system of claim 1 wherein the bladder has a substantially constant volume during operation of the semiconductor wafer test system.

4. The system of claim 1 further comprising:

a semiconductor wafer having a plurality of electrical contacts:

a support plate supporting the semiconductor wafer; and a spring supporting the support plate wherein the plurality of electrical contacts of the semiconductor wafer are aligned to the plurality of electrical contacts of the flexible membrane and wherein the bladder adapts in shape to provide physical contact between the plurality of electrical contacts of the semiconductor wafer and the plurality of electrical contacts of the flexible membrane.

5. A method of manufacturing a semiconductor device comprising the steps of:

providing a sealed bladder having a liquid and heat conductive particles, the sealed bladder having a substantially constant volume;

providing a flexible circuit layer overlying the sealed bladder, the flexible circuit layer comprising a first array of electrical contacts;

supporting a semiconductor wafer with a support plate;

supporting the support plate with springs;

positioning the semiconductor wafer over the flexible circuit layer, the semiconductor wafer comprising a second array of electrical contacts, the second array of electrical contacts aligned to the first array of electrical contacts; and pressing the sealed bladder against the flexible circuit layer such that the first array of electrical contacts physically contacts the second array of electrical contacts, the sealed bladder adapting in shape to compensate for non-planarity of the second array of electrical contacts.

* * * * *